United States Patent
de Raad

(10) Patent No.: US 9,331,067 B2
(45) Date of Patent: May 3, 2016

(54) BIGFET ESD PROTECTION THAT IS ROBUST AGAINST THE FIRST PEAK OF A SYSTEM-LEVEL PULSE

(71) Applicant: NXP B.V., Eindhoven (NL)

(72) Inventor: Gijs de Raad, Bemmel (NL)

(73) Assignee: NXP B.V., Eindhoven (NL)

( * ) Notice: Subject to any disclaimer, the term of this patent is extended or adjusted under 35 U.S.C. 154(b) by 238 days.

(21) Appl. No.: 14/025,689

(22) Filed: Sep. 12, 2013

(65) Prior Publication Data

US 2015/0070804 A1 Mar. 12, 2015

(51) Int. Cl.
*H01L 27/02* (2006.01)
*H01L 29/78* (2006.01)

(52) U.S. Cl.
CPC ........ *H01L 27/0274* (2013.01); *H01L 27/0277* (2013.01); *H01L 29/78* (2013.01)

(58) Field of Classification Search
CPC ...................................................... H02H 9/00
USPC ......................................................... 361/56
See application file for complete search history.

(56) References Cited

U.S. PATENT DOCUMENTS

| | | | |
|---|---|---|---|
| 5,982,600 A | | 11/1999 | Cheng |
| 7,068,482 B2 * | | 6/2006 | Chen ................ H01L 27/0266 361/56 |
| 7,323,752 B2 * | | 1/2008 | Chu et al. ...................... 257/360 |
| 2003/0026054 A1 | | 2/2003 | Hulfachor et al. |
| 2003/0076645 A1 * | | 4/2003 | Ker et al. ...................... 361/111 |
| 2004/0051146 A1 * | | 3/2004 | Ker et al. ...................... 257/356 |
| 2004/0179314 A1 * | | 9/2004 | Chen .............................. 361/56 |
| 2006/0001100 A1 * | | 1/2006 | Kamei et al. .................. 257/355 |
| 2006/0044714 A1 * | | 3/2006 | Chen .............................. 361/56 |
| 2007/0069310 A1 * | | 3/2007 | Song et al. ..................... 257/409 |
| 2008/0151446 A1 * | | 6/2008 | Ker et al. ........................ 361/56 |
| 2009/0086391 A1 * | | 4/2009 | Gauthier, Jr. ....... H01L 27/0285 361/56 |
| 2009/0089719 A1 * | | 4/2009 | Gauthier, Jr. ....... G06F 17/5045 716/100 |
| 2009/0261417 A1 * | | 10/2009 | Jou et al. ....................... 257/355 |
| 2010/0103570 A1 * | | 4/2010 | Song .................. H01L 29/7436 361/56 |
| 2010/0142105 A1 * | | 6/2010 | Linten ................ H01L 27/0285 361/56 |
| 2010/0148266 A1 | | 6/2010 | Foley et al. |

(Continued)

FOREIGN PATENT DOCUMENTS

JP 2011114056 A 6/2011
JP 2011176091 A 9/2011

OTHER PUBLICATIONS

Duvvury, Charvaka et al.; "Substrate Pump NMOS for ESD Protection Applications"; Electrical Overstress/Electrostatic Discharge Symposium Proceedings 2000; pp. 1-11; 2000.
European Search Report, 14180740, Jun. 26, 2015.

*Primary Examiner* — Thienvu Tran
*Assistant Examiner* — Angela Brooks
(74) *Attorney, Agent, or Firm* — Rajeev Madnawat

(57) ABSTRACT

Embodiments of an electrostatic discharge (ESD) protection device and a method of operating an ESD protection device are described. In one embodiment, an ESD protection device includes a bigFET configured to conduct an ESD pulse during an ESD event. The bigFET includes a backgate terminal, a source terminal, and a current distributor connected to the backgate terminal and the source terminal and configured to homogeneously activate a parasitic bipolar junction transistor of the bigFET in response to a current that is generated in the bigFET during the ESD pulse. Other embodiments are also described.

18 Claims, 10 Drawing Sheets

(56) References Cited

U.S. PATENT DOCUMENTS

| | | | |
|---|---|---|---|
| 2010/0296212 A1* | 11/2010 | Liang | H01L 27/0285 361/56 |
| 2010/0321841 A1* | 12/2010 | Worley | H02H 9/046 361/56 |
| 2012/0069479 A1* | 3/2012 | Lee | 361/56 |
| 2012/0236444 A1* | 9/2012 | Srivastava | H01L 27/0285 361/56 |
| 2013/0128400 A1* | 5/2013 | Yeh | H01L 27/0285 361/56 |
| 2014/0160604 A1* | 6/2014 | Lai | H02H 9/044 361/56 |

* cited by examiner

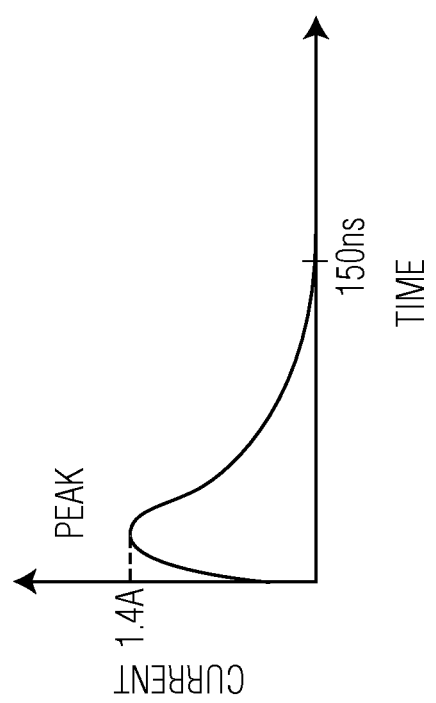

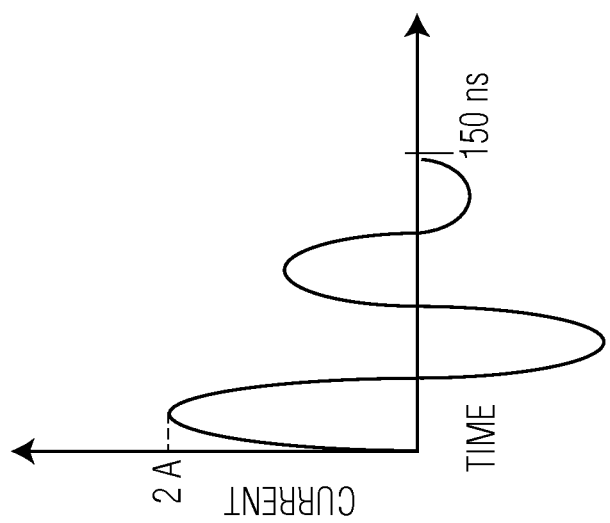

BIGFET ESD PROTECTION THAT IS ROBUST AGAINST THE FIRST PEAK OF A SYSTEM-LEVEL PULSE

Embodiments of the invention relate generally to electronic hardware and methods for operating electronic hardware, and, more particularly, to electrostatic discharge (ESD) protection devices and methods for providing ESD protection.

An ESD protection circuit can be integrated onto an integrated circuit (IC) chip to provide a low impedance channel to ground to prevent thermal damage in the IC substrate. A common ESD protection circuit, which is known as "railclamp," includes a bigFET and a trigger circuit for activating the bigFET during an ESD strike. Typically, a bigFET is an n-channel MOSFET (NMOS) transistor with a large channel width. However, it is also possible to use a p-channel MOSFET (PMOS) transistor with a large channel width as a bigFET. A bigFET based ESD protection device can be used to protect a supply domain of an IC chip from overheating during an ESD strike by shunting the ESD current from the supply domain to the ground domain. In combination with diodes, a railclamp can also be used to protect non-supply pins such as inputs, outputs, or combined input/output pins (IO's).

During a regular ESD strike or an ESD test such as a human-body-model (HBM) test or a machine-model (MM) test, a bigFET based railclamp shunts a current pulse with a peak value of 1 or 2 ampere (A). For example, a 2 kV HBM pulse can cause a peak current of around 1.4 A while a 100 V MM pulse can have a peak current of around 2 A. In contrast to HBM and MM pulses, a so-called "system-level ESD pulse," such as ESD pulses described in the International Electrotechnical Commission (IEC)-61000-4-2 standard, can have a first peak as high as 30 A, lasting about 1 nanosecond (ns), followed by a second peak as high as 16 A, lasting about 150 ns. A conventional bigFET based railclamp is typically designed without considering the possibility that a system-level ESD pulse, or part of a system-level pulse, may be conducted through the bigFET based railclamp. In the case that (part of) a system-level ESD pulse is conducted through a conventional bigFET based railclamp, there is a risk that the railclamp has to sink a significantly higher ESD current pulse than it is designed to sink. This may result in physical damage to the railclamp itself, to a core circuit that is protected by the railclamp, or both. Therefore, there is a need for a bigFET based ESD protection device that provides protection against regular ESD pulses with low peak current, and also provides protection against system-level ESD pulses with a much higher peak current as part of a larger protection network that can be implemented on the IC, the substrate (e.g., a printed circuit board (PCB)), or a combination thereof. More specifically, there is a need for bigFET ESD protection devices that survive the first peak of a system-level ESD pulse that the other components of such a larger protection network sometimes fail to protect against.

Embodiments of an electrostatic discharge (ESD) protection device and a method of operating an ESD protection device are described. In one embodiment, an ESD protection device includes a bigFET configured to conduct an ESD pulse during an ESD event. The bigFET includes a backgate terminal, a source terminal, and a current distributor connected to the backgate terminal and the source terminal and configured to homogeneously activate a parasitic bipolar junction transistor of the bigFET in response to a current that is generated in the bigFET during the ESD pulse. In contrast with a conventional railclamp, the parasitic bipolar junction transistor of the bigFET can be homogeneously activated to conduct a short, high-current peak of a system-level ESD pulse. Consequently, the ESD protection device protects against regular ESD pulses with low peak current as well as against the very short, but strong first current peak of a system-level ESD pulse. The overall protection scheme may assume the presence of additional protection elements that absorb the second current peak of the system-level ESD pulse. Other embodiments are also described.

In one embodiment, a method of providing ESD protection involves conducting an ESD pulse using a bigFET during an ESD event, which includes generating a current in the bigFET during the ESD pulse and homogeneously activating a parasitic bipolar junction transistor of the bigFET in response to the generated current.

In one embodiment, an ESD protection device includes a bigFET configured to conduct an ESD pulse during an ESD event and a decoupling capacitor connected in parallel with the bigFET. The bigFET includes a backgate terminal, a source terminal, and a resistor configured to electrically connect the backgate terminal directly to the source terminal.

Other aspects and advantages of embodiments of the present invention will become apparent from the following detailed description, taken in conjunction with the accompanying drawings, depicted by way of example of the principles of the invention.

FIGS. 3A and 3B depict two examples of a regular ESD current pulse.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
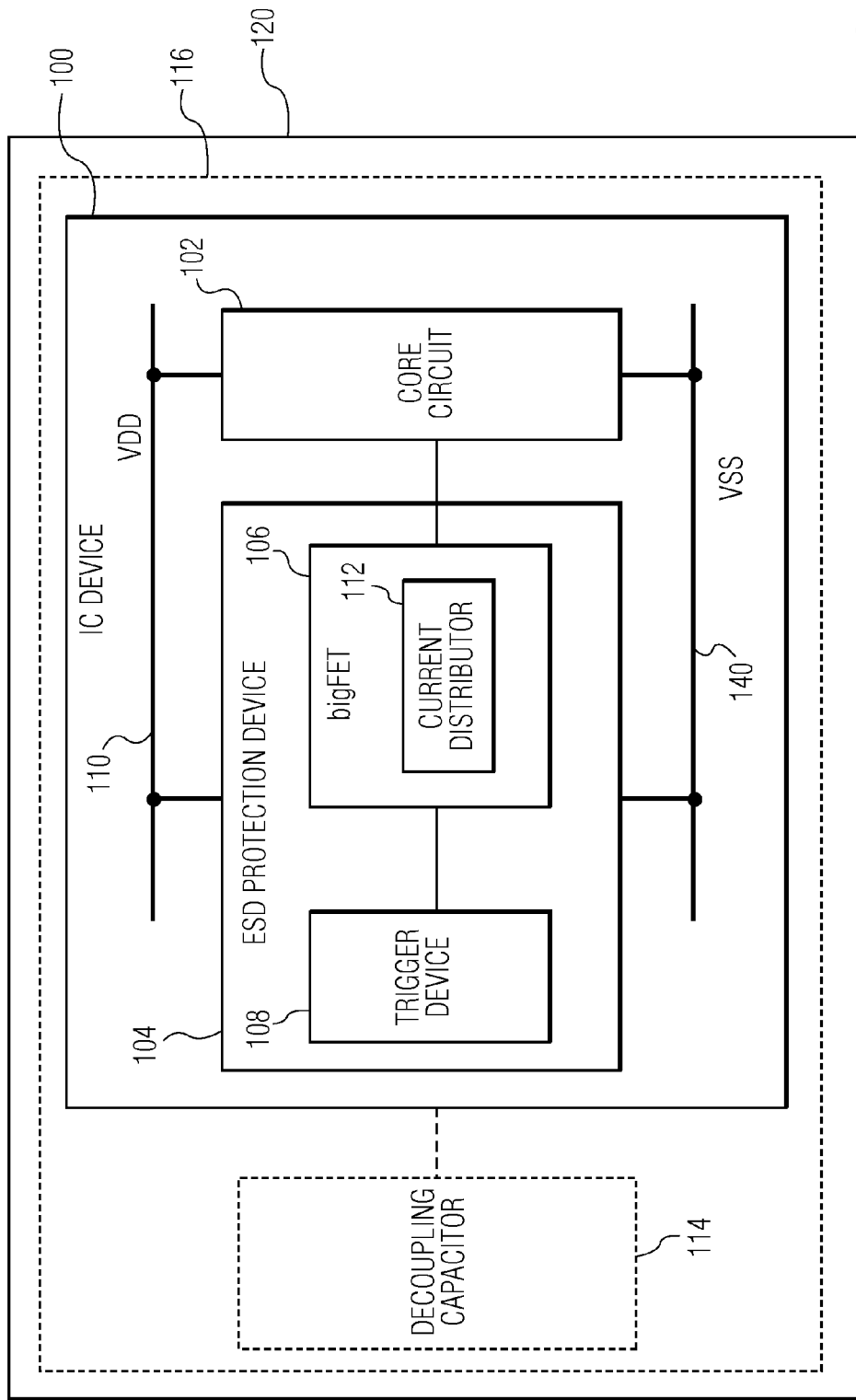
FIG. 1 is a schematic block diagram of a circuit in accordance with an embodiment of the invention.

FIG. 1 is a schematic block diagram of a circuit 120 in accordance with an embodiment of the invention. The circuit can be used in various applications, such as automotive applications, communications applications, industrial applications, medical applications, computer applications, and/or consumer or appliance applications. In the embodiment depicted in FIG. 1, the circuit includes an IC device 100, which includes a core circuit 102 and an ESD protection device 104 that is used to protect the core circuit during an ESD event, which may be an ESD test or an actual ESD strike. The IC device can be implemented in a substrate, such as a semiconductor wafer or a printed circuit board (PCB). In an embodiment, the IC device is packaged as a semiconductor IC chip. The IC device may be included in a microcontroller, which can be used for, for example, in vehicle control or communications, identification, wireless communications, and/or lighting control. In some embodiments, the IC device is included in a computing device, such as a smartphone, a tablet computer, a laptop, etc. For example, the IC device may be included in a Near Field Communications (NFC) capable computing device.

The core circuit 102 is a device to be protected by the ESD protection circuit in case of an ESD event. The core circuit typically includes one or more internal circuit components that are susceptible to ESD strikes. Examples of the core circuit include, but are not limited to, microcontrollers, transceivers, and switching circuits. In an embodiment, the core circuit includes a power supply domain of the IC device 100. For example, the core circuit may be connected to a power supply rail 110 with a supply voltage, "$V_{DD}$," of the IC device 100 and a voltage rail 140 with a lower voltage, "$V_{SS}$." Although the IC device is shown in FIG. 1 as including the core circuit and the ESD protection device 104, in other embodiments, the IC device may include additional circuit elements. For example, the IC device may include serially connected diodes that are coupled in parallel with the core circuit for current restriction and voltage surge protection.

The ESD protection device 104 protects the core circuit 102 during an ESD event. The ESD protection device 104 can be used to protect a power supply domain of the IC device 100. For example, the ESD protection device 104 may be connected to the power supply rail, "$V_{DD}$," of the IC device 100.

In the embodiment depicted in FIG. 1, the ESD protection circuit 104, which is known as "railclamp," includes a bigFET 106 configured to conduct current during an ESD event and a trigger device 108 configured to trigger the ESD element during the ESD event. The bigFET is an NMOS device (e.g., an NMOS transistor) with a large channel width or a PMOS device (e.g., a PMOS transistor) with a large channel width to sink ESD current. A bigFET can be used to protect a power supply domain of the IC device 100 from overvoltage during an ESD event by shunting the ESD current from the power supply domain to the ground domain (i.e., the ground). The channel width of a bigFET can be chosen to ensure that the voltage drop across the bigFET during an ESD event does not exceed a predetermined voltage, which is considered harmful to the inner circuit components (e.g., the core circuit 102) of the IC device. The predetermined voltage is typically set to be equal to or around (e.g., ±30%) the power supply voltage of the IC device. In some embodiments, the bigFET of the ESD protection device 104 is replaced by another suitable ESD element.

In the embodiment depicted in FIG. 1, the bigFET 106 includes a current distributor 112 connected to the backgate terminal and the source terminal of the bigFET and configured to homogeneously activate a parasitic bipolar junction transistor of the bigFET in response to a current that is generated in the bigFET during an ESD pulse. In an embodiment, homogeneously activating a parasitic bipolar junction transistor of the bigFET involves distributing the current across the bigFET in an even, uniform, and/or consistent manner. In some embodiments, the ESD pulse is a system-level ESD pulse, which generally includes a first current peak and a subsequent second current peak that is lower than the first current peak. In these embodiments, the current distributor may be configured to homogeneously activate the parasitic bipolar junction transistor of the bigFET in response to the current that is generated in the bigFET during a first peak of the ESD pulse or until the first peak of the ESD pulse elapses. The current distributor can allow the current that is generated in the bigFET to contract into a filament after the first peak of the ESD pulse elapses. In contrast with a conventional railclamp, the parasitic bipolar junction transistor of the bigFET 106 can be homogeneously activated to conduct a high current peak of a system-level ESD pulse. Consequently, the railclamp 104 protects against regular ESD pulses with low peak current as well as system-level ESD pulses with high peak current. Compared with an approach known as "substrate pumping," in which a substrate bias transient is briefly injected into the circuit 120 by an external device to activate the parasitic bipolar junction transistor of the bigFET 106, the current distributor 112 can homogeneously activate the parasitic bipolar junction transistor of the bigFET 106 in response to an internal current that is generated in the bigFET during an ESD pulse. Consequently, compared with the substrate pumping approach, the circuit 120 does not need an external current injection to activate the parasitic bipolar junction transistor of the bigFET 106.

The trigger device 108 of the railclamp 104 is capable of detecting an ESD event and driving the bigFET 106 for a certain amount of time during an ESD event. The trigger device can be implemented using one or more capacitors, transistors, and/or resistors. In some embodiments, the trigger device is similar to or the same as trigger devices described in the co-pending application (application Ser. No. 13/968,337, titled "A Bias-Insensitive Trigger Circuit for BigFET ESD Supply Protection,") filed on Aug. 15, 2013. In an embodiment, the trigger device 108 includes a slew rate detector, an optional pre-driver stage, a keep-on latch, and a driver stage. However, in other embodiments, the trigger device may include more or less components to implement more or less functionalities. The slew rate detector is a circuit that is configured to detect an ESD event, which may be an ESD test or an actual ESD strike, for example, by detecting a rise in the power supply voltage, "$V_{DD}$," of the IC device 100, which is characteristic of an ESD event. The pre-driver stage is a circuit that is configured to turn on the driver stage once an ESD event is detected by the slew rate detector. The pre-driver stage may be only active during the initial detection of an ESD event to "trigger" the driver stage. The keep-on latch is a circuit that is configured to keep the driver stage turned on for the expected maximum duration of the detected ESD event. In some embodiments, the functions of the slew rate detector and the keep-on latch are implemented in a single circuit. The driver stage is a circuit that is configured to drive the gate terminal of the bigFET.

Figure 2:
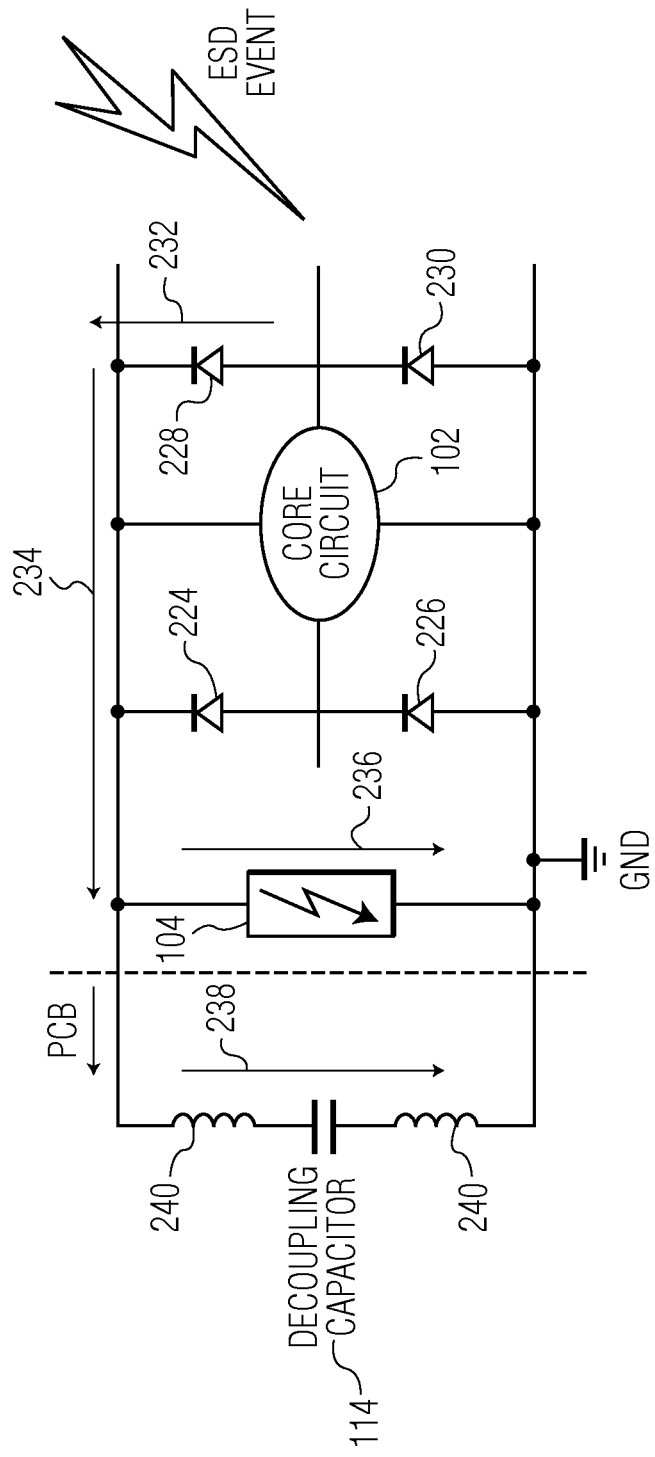
FIG. 2 illustrates an example of the ESD current paths of the circuit depicted in FIG. 1 during an ESD event.

In some embodiments, the circuit 120 includes a decoupling capacitor 114 located on a substrate 116, such as a Printed Circuit Board (PCB), of the circuit 120. In some embodiments, the decoupling capacitor is physically attached and in physical and electrical contact with the substrate. The primary purpose of the decoupling capacitor is to suppress ripple on the supply voltage during normal operation. The decoupling capacitor can be used with the railclamp 104 of the IC device 100 for robustness against system-level ESD pulses. FIG. 2 illustrates an example of ESD current paths through the railclamp 104 and the decoupling capacitor 114 of the circuit 120 during an ESD event. In FIG. 2, a dashed line separates elements on a substrate, such as a printed circuit board (PCB), with elements on an IC chip. The ESD event may cause a regular ESD pulse with a low peak current or a system-level ESD pulse with a high peak current. In the embodiment depicted in FIG. 2, serially connected diodes 224, 226 and 228, 230 are connected in parallel with the core circuit 102 for current restriction and voltage surge protection purpose.

FIGS. 3A and 3B depict two examples of a regular ESD pulse that can be conducted through the ESD current paths of FIG. 2. As depicted in FIG. 3A, the human-body-model (HBM) pulse has one low current peak around 1.4 A and a duration of 150 nanosecond (ns). As depicted in FIG. 3B, the machine-model (MM) pulse has a low current peak around 2 A, a subsequent current peak that is lower than 2 A, and a duration of 150 nanosecond (ns). Turning back to FIG. 2, during the regular ESD pulse, electrical current flows through the serially connected diodes into the ESD protection device, as shown by arrows 232, 234, and flows into the ground (GND) through the ESD protection device, as shown by arrow 236.

Figure 3C:
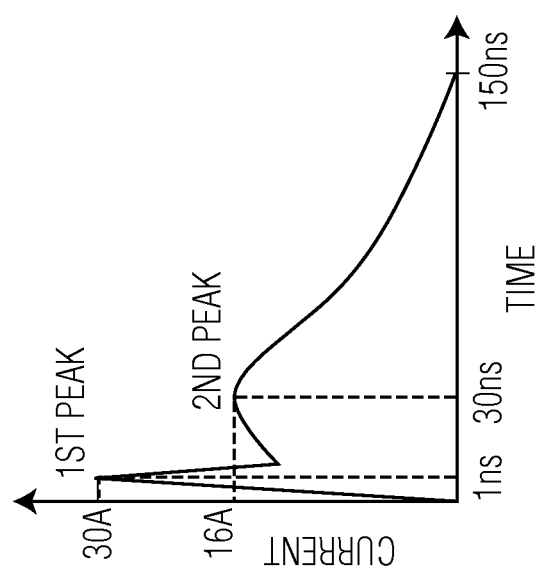
FIG. 3C depicts an example of a system-level current pulse.

FIG. 3C depicts an example of a system-level ESD pulse that can be conducted through the ESD current paths of FIG. 2. As depicted in FIG. 3C, the system-level pulse includes a first current peak and a second current peak that is lower than the first current peak. For example, the system-level pulse may have a first peak of about 30 Ampere (A) occurring about 1 ns into the pulse, followed by a second peak of 16 A occurring at around 30 ns, and a duration of around 150 ns.

Turning to FIG. 2, an ideal decoupling capacitor can absorb the first current peak as well as the second current peak of the system-level ESD pulse. However, a realistic decoupling capacitor not only has a certain capacitance but also has some parasitic inductance 240, as shown in FIG. 2. The consequence of a realistic capacitor having both a capacitance and an inductance is that a decoupling capacitor absorb only the second peak of a system-level pulse, as shown by arrow 238, and force the first peak of the system-level pulse through the railclamp 104 incorporated in the IC device 100, as shown by arrow 236.

A conventional railclamp only sinks the currents generated during a regular ESD event (e.g., an ESD test), while the current generated during a system-level ESD event is absorbed by a decoupling capacitor. Because a conventional railclamp is typically designed to sink a current of a few Amperes (A), a first current peak of a system-level ESD pulse, which may be as strong as 30 A, can damage the railclamp and ruin the core circuit. To accommodate a conventional railclamp, the negative effect of the parasitic inductance of the decoupling capacitor can be addressed by placing tight constraints on the PCB design and choosing a capacitor with minimal parasitic inductance. Reducing the parasitic inductance of the decoupling capacitor causes the decoupling capacitor to absorb mostly the first current peak of a system-level pulse. For example, a smaller decoupling capacitor with a low value of parasitic inductance can be used in parallel with a main decoupling capacitor. However, two capacitors with different characteristics are more expensive than one capacitor solution. Alternatively, a capacitor with large capacitance but low inductance can be used as the decoupling capacitor. However, a capacitor with a large capacitance but a low inductance is more expensive than a regular capacitor. Compared to a conventional railclamp that is only capable of sinking a current of around 2 A during a regular ESD event, the railclamp 104 depicted in FIG. 1 is robust against the first current peak of a system-level ESD pulse, which may be as strong as 30 A. The second current peak of the system-level pulse, which is generally lower than the first current peak of the system-level pulse, can be absorbed by the decoupling capacitor 114. Consequently, the railclamp 104 can be used with a decoupling capacitor with a relatively large inductance and the constraints that otherwise exist for the PCB design or the choice of capacitor types can be lifted. Further, a solution that relies on a railclamp to absorb/bypass the first current peak as well as the second current peak of a system-level ESD pulse requires a railclamp with a size that is about 8 to 10 times of a normal railclamp, which is significantly less economical. Compared with the solution that requires a railclamp to endure the first and second current peaks of a system-level ESD pulse, the railclamp 104 can be used with an ESD element (e.g., a decoupling capacitor) that can absorb/bypass the second peak of a system-level ESD pulse, to form an economical and compact ESD protection network against system-level ESD pulses.

Figure 4A:
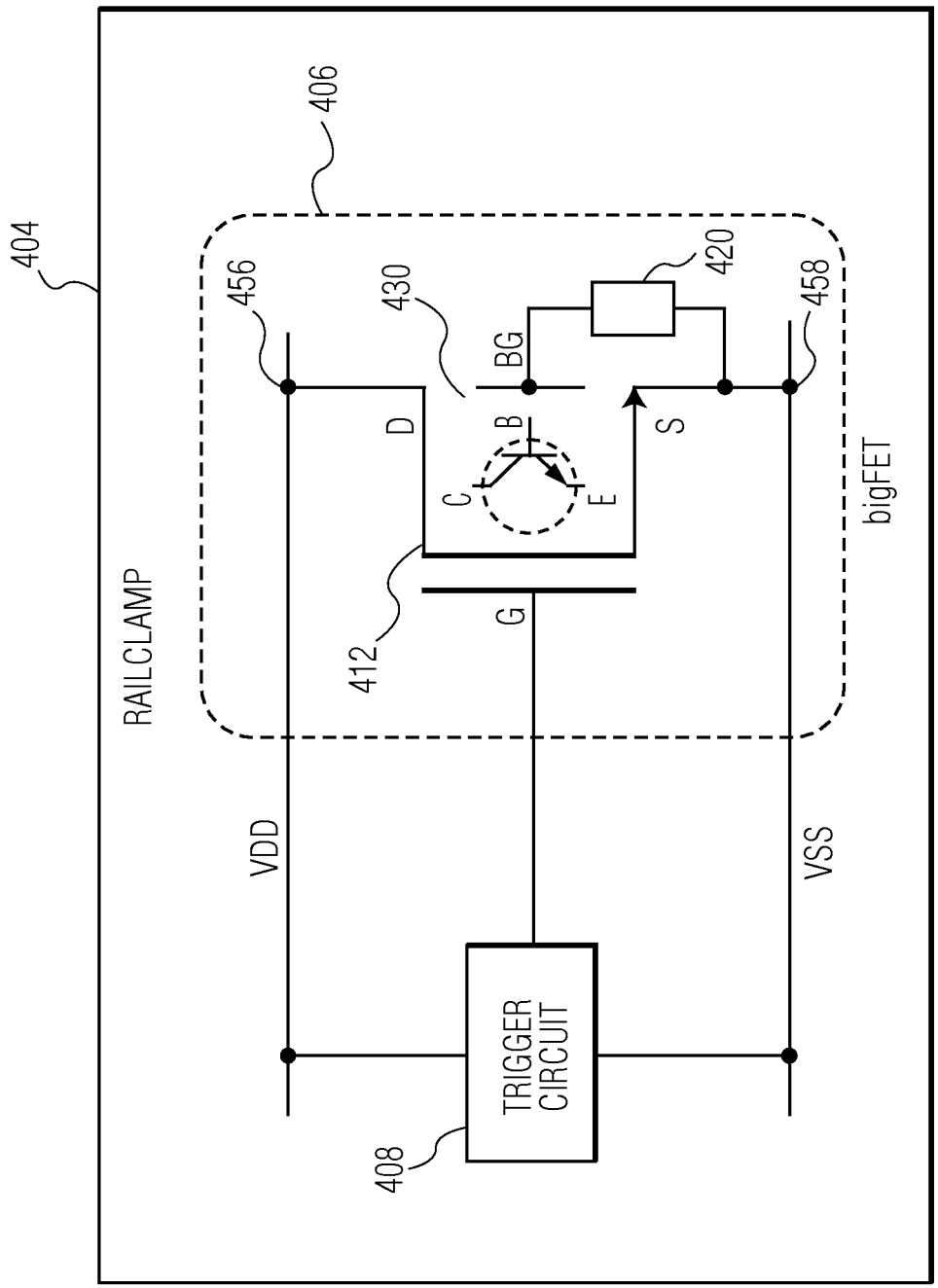
FIGS. 4A and 4B depict an embodiment of the ESD protection device depicted in FIG. 1.

FIG. 4A depicts an embodiment of the railclamp depicted in FIG. 1 that is implemented as an NMOS bigFET. In the embodiment depicted in FIG. 4A, a railclamp 404 includes the NMOS-based bigFET 406 configured to conduct current during an ESD event and a trigger device 408, which may be similar to or the same as trigger device 108, configured to trigger/activate the bigFET 406 during the ESD event. Specifically, the bigFET 406 is implemented as an NMOS transistor 412. The trigger device 408 and the NMOS transistor are connected to a supply voltage, "$V_{DD}$," at a power supply $V_{DD}$ node (e.g., a terminal or an input pad) 456 and to a lower voltage, "$V_{SS}$," at a voltage $V_{SS}$ node 458, which is set to a voltage that is, for example, zero (the ground) or around zero. Specifically, the drain terminal, "D," of the NMOS transistor is connected to the $V_{DD}$ node 456, the source terminal, "S," of the NMOS transistor is connected to the $V_{SS}$ node 458, and the gate terminal, "G," of the NMOS transistor is connected to and controlled by the trigger circuit 408. The trigger circuit 408 biases the gate terminal, "G," of the NMOS transistor at the start of an ESD event such that the NMOS transistor shunts the ESD current from the $V_{DD}$ node 456 to the $V_{SS}$ node 458 during the ESD event. The ESD current is shunted from the drain terminal (D) to the source terminal (S) of the NMOS transistor. By shunting the ESD current during the ESD event, the NMOS transistor prevents ESD damage to itself and to all of the other circuits connected between the $V_{DD}$ node and the $V_{SS}$ node. In some embodiments, the channel width of the NMOS transistor is chosen such that the entire ESD current caused by a regular ESD event flows through the NMOS transistor while keeping the voltage drop generated across the NMOS transistor below a pre-determined critical value, which is typically set to a value between 50% and 150% of the nominal value of $V_{DD}$. In an example operation, the trigger circuit 408 lifts the gate terminal, "G," of the NMOS transistor to a pre-determined potential during an ESD event, keeps the gate terminal, "G," of the NMOS transistor at the same voltage as the $V_{SS}$ node 458 when there is no ESD event, and discriminates between an ESD event and a non-ESD event by detecting a change in the potential at the drain terminal, "D," of the NMOS transistor. During an ESD pulse, the trigger circuit 408 sets the voltage on the gate terminal, "G," of the NMOS transistor to be equal to the voltage on the drain terminal, "D," of the NMOS transistor. The trigger circuit 408 allows the voltage on the gate terminal, "G," of the NMOS transistor to assume the voltage of the source terminal, "S," of the NMOS transistor at all the times during which no ESD event is occurring, so as to ensure a small stand-by leakage current of the bigFET.

Figure 4B:
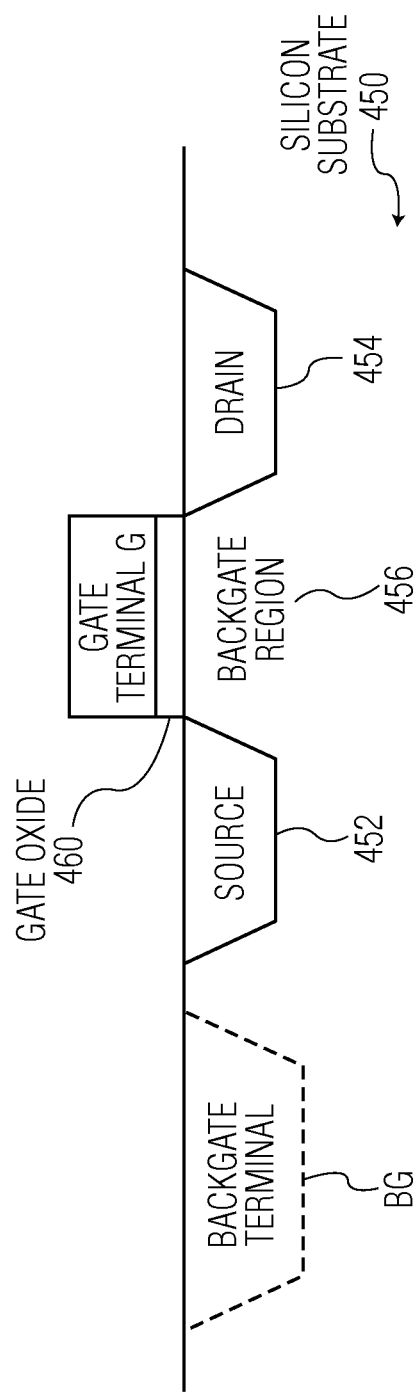

In the embodiment depicted in FIG. 4A, the NMOS transistor 412 includes a fourth terminal, known as the backgate terminal, "BG," which is kept at zero potential in order for the NMOS transistor to function. FIG. 4B depicts an embodiment of the NMOS transistor 412 that includes a source region 452, a drain region 454, and a backgate region 456. Physically, the backgate region 456 of the NMOS transistor 412 is the part of the silicon volume (the silicon substrate 450) that makes up the NMOS transistor, excluding the n-type silicon drain 454 and source 452. In the NMOS transistor, the backgate region 456 consists necessarily of p-type silicon, and for the proper functioning of the NMOS transistor, the backgate region 456 must include the silicon that sits directly beneath the gate (i.e., a gate oxide 460 and the gate terminal, "G") of the NMOS transistor, where a thin layer of silicon oxide 460 electrically separates the gate terminal from the backgate region 456. The source and drain regions 452, 454 are n-type silicon. A p/n junction is presented between the backgate region 456 and the source region 452 and between the backgate region 456 and the drain region 454, as indicated by solid lines. The backgate terminal, "BG," physically consists of p-type silicon that is much more heavily doped than the surrounding p-type silicon that makes up the backgate region 456. The backgate terminal, "BG," is indicated by dashed lines as no p/n junction exists between the backgate terminal, "BG," and the backgate region 456. The backgate terminal, "BG," provides an electrical connection between the backgate region 456 and the rest of the circuit. In some embodiments, the backgate terminal, "BG," is located near the source terminal, "S," or the drain terminal, "D." The backgate terminal, "BG," is electrically separated from the drain terminal, "D." The backgate terminal, "BG," of the NMOS transistor is connected to the source terminal, "S," of the NMOS transistor through a resistor 420 with a large resistance. In some embodiments, the resistor 420 electrically connects the backgate terminal, "BG," directly to the source terminal, "S," of the NMOS transistor. The resistor typically has a resistance that is larger than 5,000 Ohm ($\Omega$). Although in some cases, the resistor may have a resistance that is lower than 5,000$\Omega$. In some embodiments, the resistance of the resistor is around (e.g., ±5%) 10 k$\Omega$. The resistor functions as a current distributor. The NMOS bigFET 406 physically contains a parasitic npn bipolar junction transistor (BJT) 430 with a base terminal, "B," a collector terminal, "C," and a emitter terminal, "E," that may be activated when the current passing from the drain terminal, "D," of the NMOS transistor to the source terminal, "S," of the NMOS transistor exceeds a critical value. The specific physical structure of an NMOS transistor always includes a p-type silicon backgate region located between the source and drain regions that are always n-type silicon. Any such arrangement of two n-type silicon regions separated by a p-type silicon region constitutes a bipolar npn transistor. This bipolar npn transistor is considered parasitic when it is formed as a by-product when constructing circuitry in the silicon rather than as an intended and functional circuit element. Although in principle the distance between the two n-type silicon regions forming the parasitic npn bipolar transistor is arbitrary, one skilled in the art will recognize that parasitic bipolar npn transistors of which the two n-type regions are only a short distance apart (e.g., smaller than 10 micrometer ($\mu$m)) will be most relevant for circuit design, ESD protection circuit design included. When the parasitic BJT is activated, the current distribution inside the bigFET is unstable in the sense that the current has an inherent tendency to contract into a narrow filament in which the current density is extremely high. The unstable current distribution and the resulting high local current density are the physical causes of damage that a bigFET can sustain during an ESD event. The large resistor 420 between the source terminal, "S," and the backgate terminal, "BG," of the NMOS transistor makes it easier for the parasitic BJT 430 to activate and forces the parasitic BJT to turn on homogeneously, at the initial stage of a system-level ESD pulse. After the parasitic BJT has activated, the homogeneous (e.g., uniform) current distribution does not persist and the current distribution has its usual tendency to contract into a filament. However, the time for the homogeneous current distribution is longer than the duration of the first peak of a system-level ESD pulse (typically, between 1 ns and 2 ns). The tendency of the current to contract into a filament when the parasitic BJT is activated is generally stronger in NMOS bigFETs than in PMOS bigFETs.

In an example operation, the NMOS-based bigFET 406 is used with the decoupling capacitor 114 (FIG. 1) mounted on the substrate 116, such as a PCB. During a regular ESD strike, the resulting ESD current is sunk by the railclamp 404 through the NMOS transistor 412. When a system-level ESD pulse strikes, the entire first peak of the system-level ESD current pulse is sunk by the railclamp 404 through the NMOS transistor 412. Specifically, the resistor 420 connected between the source terminal, "S," and the backgate terminal, "BG," of the NMOS transistor ensures that at least initially, the parasitic BJT 430 of the railclamp 404 activates homogeneously. As the system-level ESD pulse progresses, the current distribution is expected to contract into a filament while the operation of the parasitic BJT 430 continues. However, before the completion of this contracting process, the first peak of the system-level pulse passes through the railclamp 404 without damaging the railclamp 404 or the core circuit 102. While the railclamp 404 sinks the first peak of the system-level ESD current pulse, the effects of the parasitic inductances in the decoupling capacitor subside. Consequently, after the first peak of the system-level ESD current pulse has passed, most or all of the current contained in the second peak of the system-level ESD current pulse goes into the decoupling capacitor. The decoupling capacitor absorbs all of the remaining charge of the system-level ESD pulse. As the decoupling capacitor absorbs the remaining charge of the ESD pulse, the voltage drop across the bigFET 406 sinks below the minimum value needed to sustain the operation of the parasitic BJT 430, and the operation of that parasitic BJT 430 ceases. After the operation of the parasitic BJT 430 has ceased, there is no tendency for that current to contract into a filament, nor is there any remaining risk of the bigFET 406 sustaining internal damage.

Figure 5A:
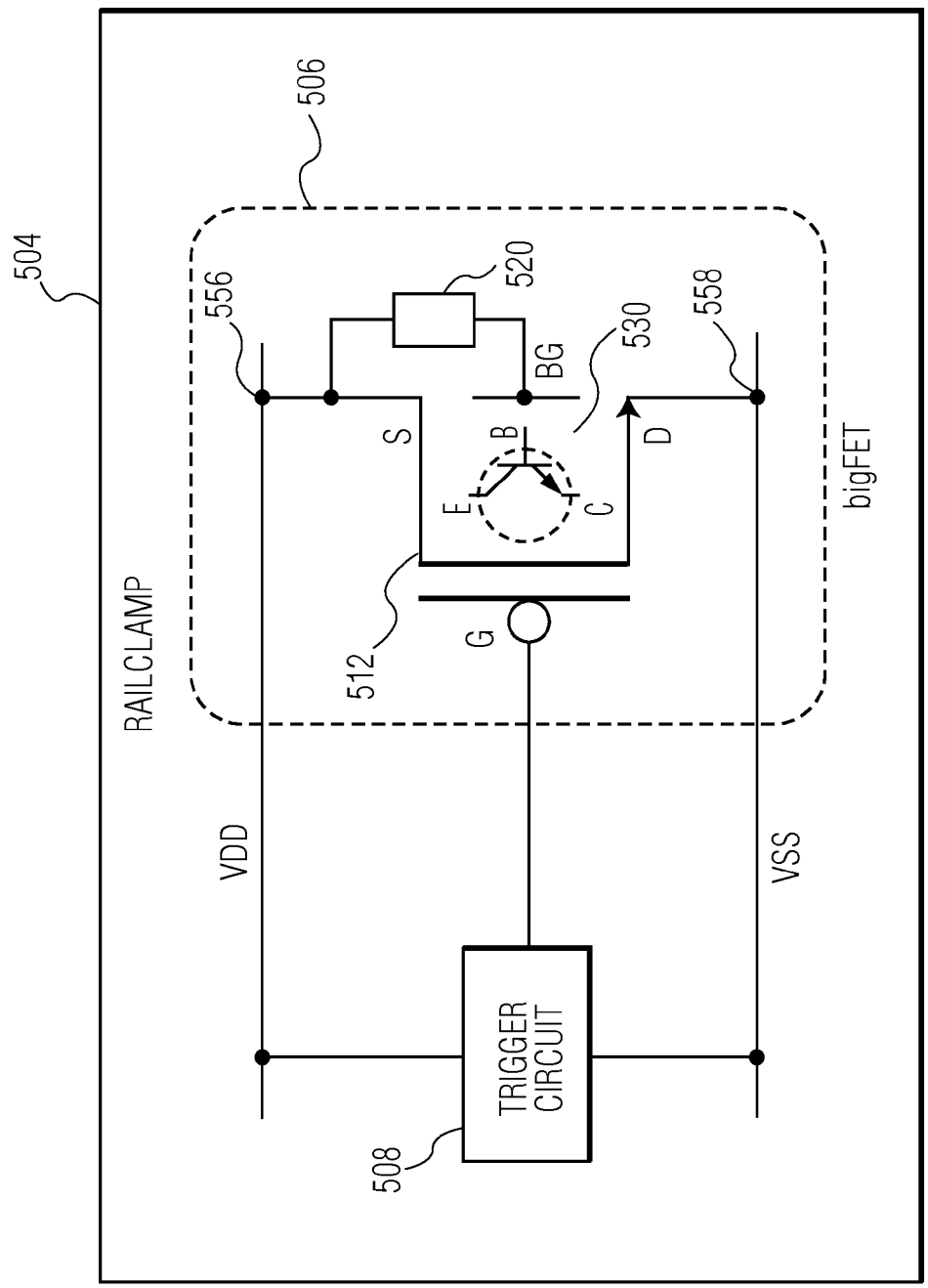
FIGS. 5A and 5B depict another embodiment of the ESD protection device depicted in FIG. 1.

In the embodiment depicted in FIG. 4A, an NMOS transistor is used in the bigFET 406. However, the invention is applicable to both an NMOS-based bigFET and a PMOS-based bigFET. FIG. 5A depicts an embodiment of the railclamp depicted in FIG. 1 that includes a PMOS-based bigFET 506 to conduct current during an ESD event. In the embodiment depicted in FIG. 5A, a railclamp 504 includes the PMOS-based bigFET 506 configured to conduct current during an ESD event and a trigger device 508, which may be similar to or the same as trigger device 108, configured to trigger/activate the bigFET 506 during the ESD event. Specifically, the bigFET 506 is implemented as a PMOS transistor 512. The trigger device 508 and the PMOS transistor are connected to a supply voltage, "$V_{DD}$," at a power supply $V_{DD}$ node (e.g., a terminal or an input pad) 556 and a lower voltage, "$V_{SS}$," at a voltage $V_{SS}$ node 558, which is set to a voltage that is, for example, zero (the ground) or around zero. The source terminal, "S," of the bigFET 506 is connected to the $V_{DD}$ node 556, the drain terminal, "D," of the bigFET 506 is connected to the $V_{SS}$ node 558, and the gate terminal, "G," of the bigFET 506 is connected to and controlled by the trigger circuit 508. The trigger circuit 508 biases the gate terminal, "G," of the bigFET 506 at the start of an ESD event such that the bigFET 506 shunts the ESD current from the $V_{DD}$ node 556 to the $V_{SS}$ node 558 during the ESD event. By shunting the ESD current during the ESD event, the bigFET 506 prevents ESD damage to itself and to all of the other circuits connected between the $V_{DD}$ node 556 and the $V_{SS}$ node 558. In some embodiments, the channel width of the bigFET 506 is chosen such that the entire ESD current caused by the ESD event flows through the bigFET 506 while keeping the voltage drop generated across the bigFET 506 below a pre-determined critical value, which is typically set to a value between 50% and 150% of the nominal value of $V_{DD}$.

Figure 5B:
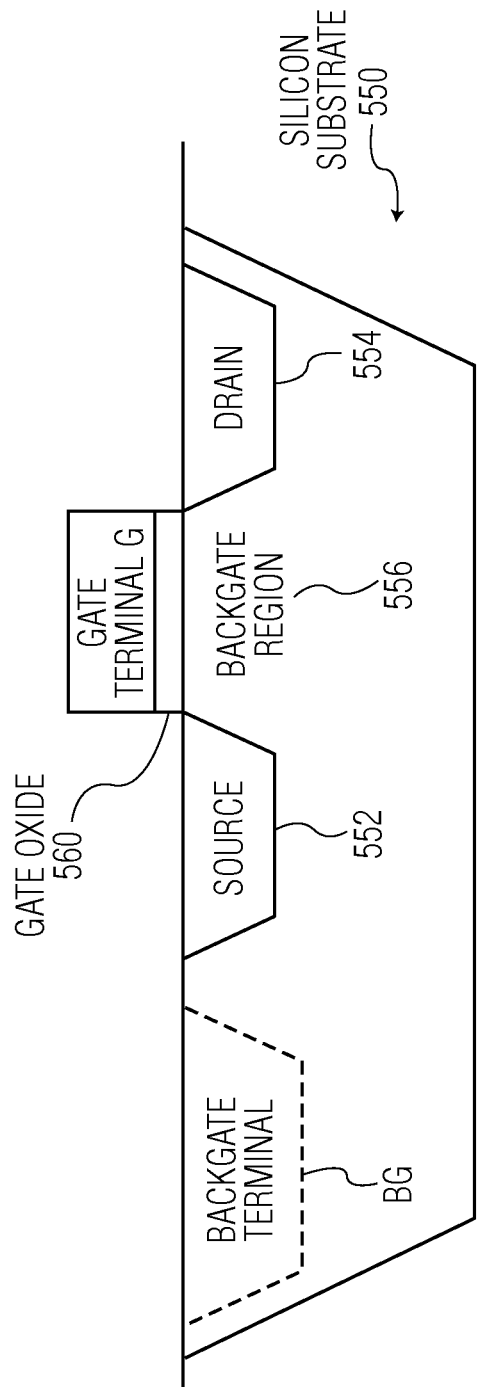

In the embodiment depicted in FIG. 5A, the PMOS transistor 512 includes a fourth terminal, known as the backgate terminal, "BG," which is kept at zero potential in order for the PMOS transistor 512 to function. FIG. 5B depicts an embodiment of the PMOS transistor 512 that includes a source region 552, a drain region 554, and a backgate region 556. Physically, the backgate region 556 of the PMOS transistor 512 is the part of the silicon volume (the silicon substrate 550) that makes up the PMOS transistor, excluding the p-type silicon drain 554 and source 552. In a PMOS transistor, the backgate region 556 consists necessarily of n-type silicon, and for the proper functioning of the PMOS transistor, the backgate region 556 must include the silicon that sits directly beneath the gate (i.e., a gate oxide 560 and the gate terminal, "G") of the PMOS transistor, where a thin layer of silicon oxide electrically separates the gate terminal from the backgate region. The source and drain regions 552, 554 are p-type silicon. The backgate region 556 is formed by an ion-implant that creates a local well of n-type silicon in which the PMOS transistor 512 is constructed. This n-type silicon well forms the backgate region 556, and the backgate terminal, "BG," is formed by a small pocket of heavily doped n-type silicon. The backgate terminal, "BG," provides an electrical connection between the backgate region 456 and the rest of the circuit. The backgate terminal, "BG," provides an electrical connection between the backgate region 556 and the rest of the circuit. In some embodiments, the backgate terminal, "BG," is located near the source terminal, "S," or the drain terminal, "D." The backgate terminal, "BG," is electrically separated from the drain terminal, "D." The backgate terminal, "BG," of the PMOS transistor is connected to the source terminal, "S," of the PMOS transistor through a resistor 520 with a large resistance. In some embodiments, the resistor 520 electrically connects the backgate terminal, "BG," directly to the source terminal, "S," of the PMOS transistor without other resistive elements. The resistor 520 typically has a resistance that is larger than 5,000Ω. In some embodiments, the resistance of the resistor 520 is around (e.g., ±5%) 10 kΩ. The PMOS bigFET 506 physically contains a parasitic pnp BJT 530, with a base terminal, "B," a collector terminal, "C," and a emitter terminal, "E," that may be activated when the current passing from the drain terminal, "D," of the PMOS transistor to the source terminal, "S," of the PMOS transistor exceeds a critical value. The specific physical structure of a PMOS transistor always includes a n-type silicon backgate region located between the source and drain regions that are always p-type silicon. Any such arrangement of two p-type silicon regions separated by an n-type silicon region constitutes a bipolar pnp transistor. This bipolar pnp transistor is considered parasitic when it is formed as a by-product when constructing circuitry in the silicon rather than as an intended and functional circuit element. Although in principle the distance between the two p-type silicon regions forming the parasitic pnp bipolar transistor is arbitrary, one skilled in the art will recognize that parasitic bipolar pnp transistors of which the two p-type regions are only a short distance apart (e.g., smaller than 10 micrometer (μm)) will be most relevant for circuit design, ESD protection circuit design included.

In an example operation, the PMOS-based bigFET 506 is used with the decoupling capacitor 114 (FIG. 1) mounted on the substrate 116, such as a PCB. During a regular ESD strike, the resulting ESD current is sunk by the railclamp 504 through the PMOS transistor 512. When a system-level ESD pulse strikes, the entire first peak of the system-level ESD current pulse is sunk by the railclamp 504 through the NMOS transistor 512. Specifically, the resistor 230 connected between the source terminal, "S," and the backgate terminal, "BG," of the PMOS transistor ensures that at least initially, the parasitic BJT 530 of the railclamp 504 activates homogeneously. As the system-level ESD pulse progresses, the current distribution is expected to contract into a filament while the operation of the parasitic BJT 530 continues. However, before the completion of this contracting process, the first peak of the system-level pulse passes through the railclamp 504 without damaging the railclamp 504 or the core circuit 102. While the railclamp 504 sinks the first peak of the system-level ESD current pulse, the effects of the parasitic inductances in the decoupling capacitor subsides. Consequently, after the first peak of the system-level ESD current pulse has passed, most or all of the current contained in the second peak of the system-level ESD current pulse goes into the decoupling capacitor. The decoupling capacitor absorbs all of the remaining charge of the system-level ESD pulse. As the decoupling capacitor absorbs the remaining charge of the ESD pulse, the voltage drop across the bigFET 506 sinks below the minimum value needed to sustain the operation of the parasitic BJT 530, and the operation of that parasitic BJT 530 ceases. After the operation of the parasitic BJT 530 has ceased, there is no tendency for that current to contract into a filament, nor is there any remaining risk of the bigFET 506 sustaining internal damage.

Figure 6:
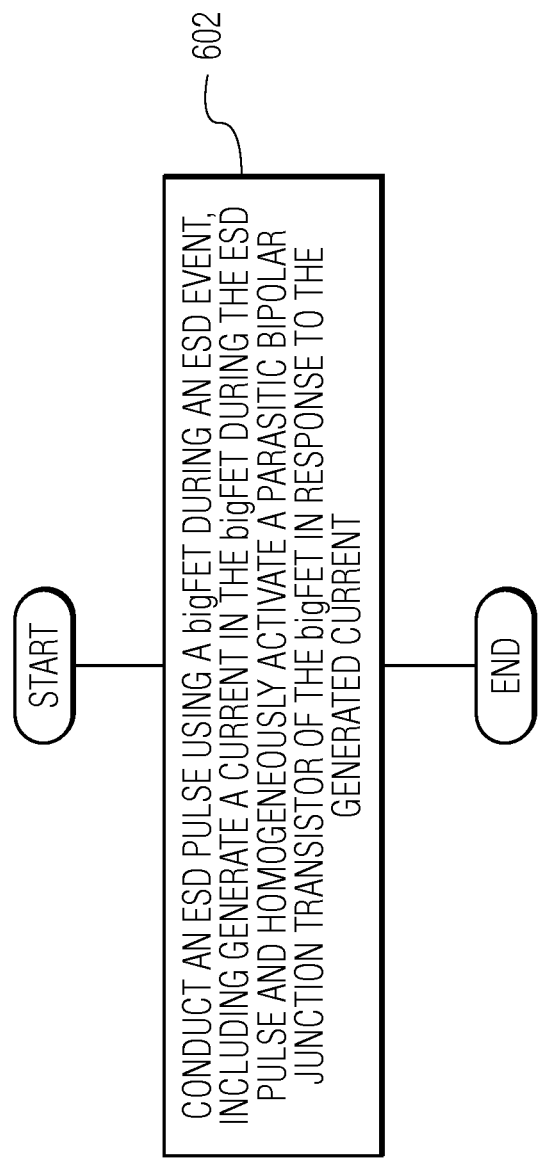
FIG. 6 is a process flow diagram that illustrates a method for providing ESD protection in accordance with an embodiment of the invention.

FIG. 6 is a process flow diagram that illustrates a method for providing ESD protection accordance with an embodiment of the invention. At block 602, an ESD pulse is conducted using a bigFET during an ESD event by generating a current in the bigFET during the ESD pulse and homogeneously activating a parasitic bipolar junction transistor of the bigFET in response to the generated current. The bigFET may be the same as or similar to the bigFETs 106, 406, 506 depicted in FIGS. 1, 4A, 5A.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. An electrostatic discharge (ESD) protection device, the ESD protection device comprising: a bigFET configured to conduct an ESD pulse during an ESD event, the bigFET comprising: a backgate terminal; a source terminal; a current distributor connected to the backgate terminal and the source terminal and configured to homogeneously activate a parasitic bipolar junction transistor of the bigFET in response to a current that is generated during a first current peak of the ESD pulse; and a trigger device including a capacitor and configured to drive the bigFET for at least a part of time during the ESD pulse.

2. The ESD protection device of claim 1, wherein the parasitic bipolar junction transistor is physically contained within the bigFET.

3. The ESD protection device of claim 1, further comprising an ESD element connected in parallel with the bigFET and configured to absorb the second current peak of the ESD pulse.

4. The ESD protection device of claim 1, wherein the current distributor is configured to allow the current that is generated in the bigFET to contract into a filament after the first peak of the ESD pulse elapses.

5. The ESD protection device of claim 1, wherein the current distributor comprises a resistor connected to the backgate terminal and the source terminal of the bigFET.

6. The ESD protection device of claim 5, wherein the resistance of the resistor is larger than 5,000 Ohm.

7. The ESD protection device of claim 1, wherein the bigFET comprises an NMOS transistor or a PMOS transistor that further comprises a gate terminal and a drain terminal.

8. The ESD protection device of claim 1, further comprising a wherein the trigger device configured to trigger a gate terminal of the bigFET during the ESD event.

9. The ESD protection device of claim 8, wherein a drain terminal or the source terminal of the bigFET is connected to a supply node to which a power supply voltage is applied, wherein the source terminal or the drain terminal of the bigFET is connected to a second node to which a second voltage is applied, and wherein the second voltage is lower than the power supply voltage.

10. The ESD protection device of claim 9, wherein the second voltage is the ground.

11. An integrated circuit (IC) device comprising the ESD protection device of claim 1 and a device to be protected.

12. A method of providing electrostatic discharge (ESD) protection, the method comprising: conducting an ESD pulse using a bigFET during an ESD event, wherein conducting the ESD pulse using the bigFET comprises: generating a current in the bigFET during the ESD pulse; and homogeneously activating a parasitic bipolar junction transistor of the bigFET in response to the generated current during a first current peak of the ESD pulse; and driving the bigFET for at least a part of time during the ESD pulse through a trigger device that includes a capacitor.

13. The method of claim 12, wherein the parasitic bipolar junction transistor is physically contained within the bigFET, wherein the method further comprising absorbing the second current peak using an ESD element connected in parallel with the bigFET.

14. The method of claim 12, wherein homogeneously activating the parasitic bipolar junction transistor comprises allowing the current that is generated in the bigFET to contract into a filament after the first peak of the ESD pulse elapses.

15. The method of claim 12, wherein homogeneously activating the parasitic bipolar junction transistor comprises homogeneously activating the parasitic bipolar junction transistor using a resistor connected to the backgate terminal and the source terminal of the bigFET, and wherein the resistance of the resistor is larger than 5,000 Ohm.

16. An electrostatic discharge (ESD) protection device, the ESD protection device comprising: a bigFET configured to conduct an ESD pulse during an ESD event, the bigFET comprising: a backgate terminal; a source terminal; and a resistor configured to electrically connect the backgate terminal directly to the source terminal and configured to homogeneously activate a parasitic bipolar junction transistor of the bigFET in response to a current that is generated during a first current peak of the ESD pulse; and a trigger device including a capacitor and configured to drive the bigFET for at least a part of time during the ESD pulse.

17. A circuit comprising:
   an integrated circuit (IC) device comprising the bigFET of claim 16 and a device to be protected;
   a substrate on which the decoupling capacitor of claim 16 is located.

18. The ESD protection device of claim 16, wherein the parasitic bipolar junction transistor is physically contained within the bigFET, wherein the bigFET comprises an NMOS transistor or a PMOS transistor that further comprises a gate terminal and a drain terminal, wherein the ESD protection device further comprises a trigger device configured to trigger the gate terminal of the bigFET during the ESD event, wherein the drain terminal or the source terminal of the bigFET is connected to a supply node to which a power supply voltage is applied, wherein the source terminal or the drain terminal of the bigFET is connected to a second node to which a second voltage is applied, and wherein the second voltage is lower than the power supply voltage.

\* \* \* \* \*